(12) United States Patent
Jeong et al.

(10) Patent No.: US 10,354,774 B2
(45) Date of Patent: *Jul. 16, 2019

(54) COMPOSITION FOR FORMING CONDUCTIVE PATTERN AND RESIN STRUCTURE HAVING CONDUCTIVE PATTERN

(71) Applicant: LG CHEM, LTD., Seoul (KR)

(72) Inventors: Han Nah Jeong, Daejeon (KR); Ha Na Lee, Daejeon (KR); Cheol-Hee Park, Daejeon (KR); Chee-Sung Park, Daejeon (KR); Jae Hyun Kim, Daejeon (KR); Shin Hee Jun, Daejeon (KR); Ryul Lee, Daejeon (KR); Min Ji Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 282 days.

This patent is subject to a terminal disclaimer.

(21) Appl. No.: 15/317,023

(22) PCT Filed: Aug. 3, 2015

(86) PCT No.: PCT/KR2015/008101
§ 371 (c)(1),
(2) Date: Dec. 7, 2016

(87) PCT Pub. No.: WO2016/021898
PCT Pub. Date: Feb. 11, 2016

(65) Prior Publication Data
US 2017/0140849 A1    May 18, 2017

(30) Foreign Application Priority Data

Aug. 4, 2014   (KR) .................. 10-2014-0100040
Jul. 31, 2015  (KR) .................. 10-2015-0109125

(51) Int. Cl.
*H01B 1/22*     (2006.01)
*B32B 3/10*     (2006.01)
(Continued)

(52) U.S. Cl.
CPC .............. *H01B 1/22* (2013.01); *B32B 3/10* (2013.01); *B32B 15/00* (2013.01); *C08K 3/32* (2013.01);
(Continued)

(58) Field of Classification Search
CPC ..... H01B 1/22; Y10T 428/24802; C08K 3/32; H05K 3/105
See application file for complete search history.

(56) References Cited

U.S. PATENT DOCUMENTS 5,310,966 A   5/1994 Iida et al.
5,489,639 A   2/1996 Faber et al.
(Continued)

FOREIGN PATENT DOCUMENTS

CN   101278607 A   10/2008
CN   101747650 A   6/2010
(Continued)

OTHER PUBLICATIONS

Machine translation of CN 103741125 acquired on Nov. 12, 2018.*
(Continued)

*Primary Examiner* — Gerard Higgins
(74) *Attorney, Agent, or Firm* — Dentons US LLP

(57) ABSTRACT

The present invention relates to a composition for forming a conductive pattern that enables forming conductive micropatterns on various polymer resin products or resin layers by a simplified process without deformation of the polymer
(Continued)

resin products or resin layers, and enables effectively satisfying requirements of the art, and a resin structure having a conductive pattern.

10 Claims, 5 Drawing Sheets

(51) Int. Cl.
B32B 15/00 (2006.01)
C08K 3/32 (2006.01)
H01B 5/14 (2006.01)
H05K 1/03 (2006.01)
H05K 1/09 (2006.01)
H05K 3/10 (2006.01)
H05K 3/38 (2006.01)
C23C 18/16 (2006.01)
C23C 18/40 (2006.01)

(52) U.S. Cl.
CPC ...... *C23C 18/1608* (2013.01); *C23C 18/1612* (2013.01); *C23C 18/1641* (2013.01); *C23C 18/405* (2013.01); *H01B 5/14* (2013.01); *H05K 1/0373* (2013.01); *H05K 1/09* (2013.01); *H05K 3/105* (2013.01); *H05K 3/386* (2013.01); *C08K 2003/329* (2013.01); *Y10T 428/24802* (2015.01); *Y10T 428/24851* (2015.01); *Y10T 428/24909* (2015.01); *Y10T 428/24917* (2015.01)

(56) References Cited

U.S. PATENT DOCUMENTS

| 5,981,069 | A | 11/1999 | Tani et al. |
|---|---|---|---|
| 7,060,421 | B2 | 6/2006 | Naundorf et al. |
| 9,318,243 | B2 | 4/2016 | Uchida |
| 10,065,860 | B2 * | 9/2018 | Choi, II ............ C01B 15/16 |
| 2008/0286488 | A1 | 11/2008 | Li et al. |
| 2009/0277672 | A1 | 11/2009 | Matsumoto |
| 2009/0292048 | A1 | 11/2009 | Li et al. |
| 2009/0292051 | A1 | 11/2009 | Li et al. |
| 2011/0281135 | A1 | 11/2011 | Gong et al. |
| 2012/0065313 | A1 | 3/2012 | Demartin Maeder et al. |
| 2012/0279764 | A1 | 11/2012 | Jiang et al. |
| 2013/0022871 | A1 | 1/2013 | Traulsen et al. |
| 2013/0214460 | A1 | 8/2013 | Rogers et al. |
| 2013/0289178 | A1 | 10/2013 | Li et al. |
| 2014/0002311 | A1 | 1/2014 | Takano et al. |
| 2014/0076616 | A1 | 3/2014 | Meng et al. |
| 2016/0186322 | A1 | 6/2016 | Zhou et al. |

FOREIGN PATENT DOCUMENTS

| CN | 101801674 A | 8/2010 |
|---|---|---|
| CN | 102066122 A | 5/2011 |
| CN | 103053227 A | 4/2013 |
| CN | 103741125 A | 4/2014 |
| EP | 0665118 A1 | 8/1995 |
| EP | 2676799 A1 | 12/2013 |
| JP | 08-187951 A | 7/1996 |
| JP | 09-241862 A | 9/1997 |
| JP | 2001-146542 A | 5/2001 |
| JP | 2007-287994 A | 11/2007 |
| JP | 2013-144767 A | 7/2013 |
| KR | 10-1993-0019080 A | 9/1993 |
| KR | 10-0716486 B1 | 5/2007 |
| KR | 10-2010-0040803 A | 4/2010 |
| KR | 10-2013-0054847 A | 5/2013 |
| KR | 10-2013-0064824 A | 6/2013 |
| KR | 101377273 B1 | 3/2014 |
| KR | 10-2014-0082810 A | 7/2014 |
| WO | 2009/141799 A1 | 11/2009 |
| WO | 2009/141800 A2 | 11/2009 |
| WO | 2009141800 A2 | 11/2009 |
| WO | 2015/039572 A1 | 3/2015 |

OTHER PUBLICATIONS

"Study of inorganic transparent materials with near-infrared absorbing properties", Florian Norindr (University. of Southampton); Sep. 2009.

* cited by examiner

COMPOSITION FOR FORMING CONDUCTIVE PATTERN AND RESIN STRUCTURE HAVING CONDUCTIVE PATTERN

CROSS REFERENCE TO RELATED APPLICATION(S)

This application is a 35 USC § 371 National Stage entry of International Application No. PCT/KR2015/008101 filed on Aug. 3, 2015, and claims the benefit of Korean Patent Application No. 10-2014-0100040 filed on Aug. 4, 2014 and Korean Patent Application No. 10-2015-0109125 filed on Jul. 31, 2015, all of which are incorporated by reference in their entirety for all purposes as if fully set forth herein.

TECHNICAL FIELD

The present invention relates to a composition for forming a conductive pattern that enables forming conductive micropatterns on various polymer resin products or resin layers by a simplified process without deformation of the polymer resin products or resin layers, and enables effectively satisfying requirements of the art such as realization of various colors, and the like, and a resin structure having a conductive pattern.

BACKGROUND

With the recent development of microelectronic technology, a demand for a structure having a conductive micropattern formed on the surface of various polymer resin substrates (or products) such as resin products or resin layers is increasing. Such a conductive pattern of the polymer resin substrate surface can be applied for forming various objects such as antenna integrated into an electronic device case, various sensors, MEMS structure or RFID tags, and the like.

As such, with the increasing interest in the technology of forming a conductive pattern on a polymer resin substrate surface, several technologies have been suggested. However, a method capable of more effectively using such technology has not been suggested yet.

For example, according to the previously known technology, a method of forming a metal layer on the surface of a polymer resin substrate and then applying photolithography to form a conductive pattern, or a method of printing a conductive paste to form a conductive pattern, and the like, may be considered. However, if a conductive pattern is formed by such a technology, required processes or apparatuses may become excessively complicated, or it may become difficult to form a satisfactory and fine conductive pattern.

Thus, there has been a demand for the development of technology capable of effectively forming a conductive micropattern on the surface of a polymer resin substrate by a more simplified process.

As one of the technology capable of fulfilling the requirements of the art, a method of including specific inorganic additives in resin, irradiating electromagnetic wave such as laser to a part where a conductive pattern is to be formed, and then, progressing plating, and the like, on the region to which electromagnetic wave is irradiated, thereby simply forming a conductive pattern on the surface of a polymer resin substrate has been known.

However, in this method of forming a conductive pattern, those previously suggested as the inorganic additives influence on the properties of the resin, and thus, the properties of the obtained polymer resin product or resin layer are poor, or it may be difficult to realize various colors. Thus, there is a demand for the development of various kinds of inorganic additives capable of fulfilling various requirements of the art such as realization of various colors, and the like, without causing degeneration of resin.

DISCLOSURE

Technical Problem

It is an object of the present invention to provide a composition for forming a conductive pattern that enables forming conductive micropatterns on various polymer resin products or resin layers by a simplified process without deformation of the polymer resin products or resin layers, and enables effectively satisfying requirements of the art such as realization of various colors, and the like.

It is another object of the present invention to provide a resin structure having a conductive pattern formed from the above composition for forming a conductive pattern, through a method of forming a conductive pattern.

Technical Solution

According to one embodiment of the invention, a composition for forming a conductive pattern by electromagnetic wave irradiation, comprising polymer resin; and a non-conductive metal compound comprising a compound represented by the following Chemical Formula 1, wherein metal nuclei are formed form the non-conductive metal compound by the electromagnetic wave irradiation, is provided.

$$Cu_{3-x}M_xP_2O_8 \qquad \text{[Chemical Formula 1]}$$

in the Chemical Formula 1,

M is one or more metal selected form the group consisting of Ti, V, Cr, Mn, Fe, Co, Ni, Y, Zn, Nb, Mo, Tc, Pd, Ag, Ta, W, Pt, Mg, Ca, Sr and Au, and x is a rational number of 0 or more and less than 3.

The non-conductive metal compound may have a triclinic structure, and belong to a $P\bar{1}$ space group. More specifically, the non-conductive metal compound may have a three dimensional structure wherein square planar $CuO_4$ or $MO_4$; a trigonal bipyramid of $CuO_5$ or $MO_5$; and a tetrahedron $PO_4$ are three-dimensionally connected while sharing oxygen.

Meanwhile, in the composition for forming a conductive pattern, the polymer resin may be thermosetting resin or thermoplastic resin, and specific examples thereof may include ABS (Acrylonitrile poly-butadiene styrene) resin, polyalkylene terephthalate resin, polycarbonate resin, polypropylene resin and polyphthalamide resin.

And, in the composition for forming a conductive pattern, the non-conductive metal compound may be included in the content of about 0.1 to 15 wt %, based on the total composition.

And, the composition for forming a conductive pattern may further comprise one or more additives selected from the group consisting of a flame retardant, a heat stabilizer, a UV stabilizer, a lubricant, an antioxidant, inorganic filler, a color additive, an impact modifier and a functional reinforcing agent.

Meanwhile, according to another embodiment of the invention, a resin structure having a conductive metal layer (conductive pattern) that is formed on the surface of a polymer resin substrate using the above explained composition for forming a conductive pattern, is provided. Such a resin structure having a conductive pattern may comprise a polymer resin substrate; a non-conductive metal compound dispersed in the polymer resin substrate, and comprising a compound represented by the following Chemical Formula 1; an adhesion active surface comprising metal nuclei exposed to a predetermined region of the surface of the polymer resin substrate; and a conductive metal layer formed on the adhesion active surface.

$$Cu_{3-x}M_xP_2O_8 \quad \text{[Chemical Formula 1]}$$

in the Chemical Formula 1,

M is one or more metal selected form the group consisting of Ti, V, Cr, Mn, Fe, Co, Ni, Y, Zn, Nb, Mo, Tc, Pd, Ag, Ta, W, Pt, Mg, Ca, Sr and Au, and x is a rational number of 0 or more and less than 3.

In the resin structure having a conductive pattern, the predetermined region on which the adhesion active surface and the conductive metal layer are formed may correspond to the region of the polymer resin substrate to which electromagnetic wave is irradiated.

Advantageous Effects

According to the present invention, a composition for forming a conductive pattern that enables forming conductive micropatterns on polymer resin substrates such as various polymer resin products or resin layers by a very simplified process of irradiating electromagnetic wave such as laser, and the like, and a resin structure having a conductive pattern therefrom, are provided.

Particularly, if the above composition for forming a conductive pattern is used, good conductive patterns may be easily formed on resin structures, while effectively satisfying requirements of the art to realize various colors, without causing deformation of the resin structures (various polymer resin products or resin layers, and the like).

Thus, using such a composition for forming a conductive pattern, conductive patterns, RFID tags, various sensors, MEMS structure, and the like may be very effectively formed on various resin products such as mobile phones or tablet PC cases, and the like.

DETAILED DESCRIPTION OF THE EMBODIMENTS

Hereinafter, a composition for forming a conductive pattern according to specific embodiments and a resin structure having a conductive pattern formed therefrom will be explained.

According to one embodiment of the invention, a composition for forming a conductive pattern by electromagnetic wave irradiation, comprising polymer resin; and a non-conductive metal compound comprising a compound represented by the following Chemical Formula 1, wherein metal nuclei are formed form the non-conductive metal compound by the electromagnetic wave irradiation, is provided.

$$Cu_{3-x}M_xP_2O_8 \quad \text{[Chemical Formula 1]}$$

in the Chemical Formula 1,

M is one or more metal selected form the group consisting of Ti, V, Cr, Mn, Fe, Co, Ni, Y, Zn, Nb, Mo, Tc, Pd, Ag, Ta, W, Pt, Mg, Ca, Sr and Au, and x is a rational number of 0 or more and less than 3.

The composition for forming a conductive pattern of one embodiment comprises a specific non-conductive metal compound represented by the above Chemical Formula 1.

Figure 1:
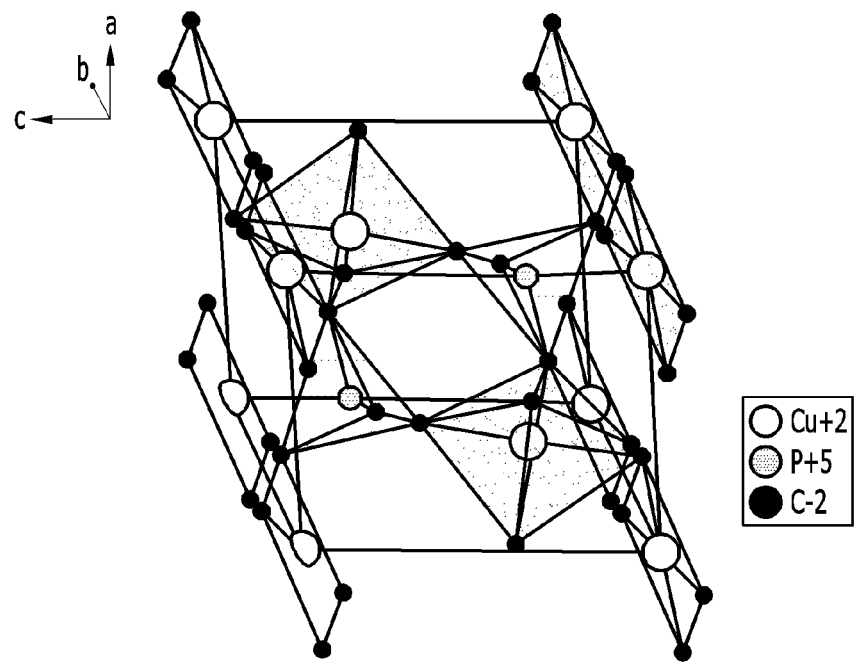
FIG. 1 schematically shows the structure of $Cu_3P_2O_8$ included the composition for forming a conductive pattern according to one embodiment of the invention.

The specific non-conductive metal compound represented by the Chemical Formula 1 may have a triclinic structure which has the smallest symmetry among the 7 crystal systems. In the triclinic structure, the lengths of 3 vectors making up a unit cell are all different (a≠b≠c), and the angles made by the vectors are different to each other and are not right angle (α≠β≠γ≠90). And, the non-conductive metal compound may belong to a $P\bar{1}$ space group. FIG. 1 schematically shows such a triclinic structure of the non-conductive metal compound.

Referring to FIG. 1, in the non-conductive metal compound having a triclinic structure, Cu and M may be positioned at two sites. Specifically, they may be positioned at M1 site wherein 1 Cu or M is coordinated by 4 oxygens to form a square planar local symmetry, and at M2 site wherein 1 Cu or M is coordinated by 5 oxygens to form a trigonal bipyramid local symmetry. And, the non-conductive metal compound may comprise a tetrahedron of $PO_4$ wherein 1 P is coordinated by 4 oxygens to form a local symmetry. Such sites forming a local symmetry may be three-dimensionally connected while sharing oxygen, to form a triclinic structure, as shown in FIG. 1. Specifically, the non-conductive metal compound may have a three-dimensional structure wherein square planar $CuO_4$ or $MO_4$; a trigonal bipyramid of $CuO_5$ or $MO_5$; and a tetrahedron of $PO_4$ are three-dimensionally connected while sharing oxygen, as shown in FIG. 1.

As will be explained in more detail below, if a polymer resin product or resin layer is formed using a composition for forming a conductive pattern comprising such a non-conductive metal compound, and then, electromagnetic wave such as laser is irradiated to a predetermined region thereof, metal nuclei may be formed from the non-conductive metal compound. Although the non-conductive metal compound is chemically stable under general environment, in the region exposed to electromagnetic wave such as near infrared ray wavelength, the metal nuclei may be more easily formed.

Figure 2:
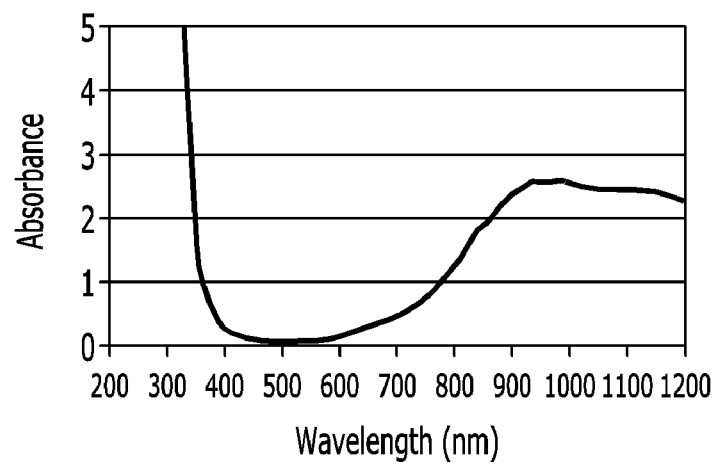
FIG. 2 is a graph showing the absorbance according to wavelength (nm) of $Cu_3P_2O_8$ included the composition for forming a conductive pattern according to one embodiment of the invention. The absorbance is a value calculated as $(1-R\%*0.01)^2/(2R\%*0.01)$ according to the Kubelka-Munk equation, and R % is a diffuse reflectance that can be measured with Uv-Visible spectroscopy.

More specifically, the non-conductive metal compound represented by the Chemical Formula 1, as shown in FIG. 2 (horizontal axis: wavelength (nm), vertical axis: absorbance) has a low absorbance of visible ray area (about 300 nm to 700 nm), and exhibits a high absorbance at near infrared ray to infrared ray area (about 700 nm to 3000 nm). The strong absorbance at near infrared ray area of the non-conductive metal compound arises from the local symmetry of the trigonal bipyramid made by $CuO_5$. The first reason is that $Cu^{2+}$ existing in the center of the trigonal bipyramid is positioned at a non-centrosymmetric site, thus enabling Laporte allowed transition at the d-orbital of $Cu^{2+}$. The second reason is that energy level transition arising from the crystal structure less comprises a visible ray area (about 300 nm to 700 nm), and comprises a significant portion of near infrared ray to infrared ray area (about 700 nm to 3000 nm). Thus, since the non-conductive metal compound has a low absorbance of visible ray area and a high absorbance of near infrared ray to infrared ray areas, even if it has a bright color, it easily reacts to the stimulation of the electromagnetic wave of near infrared ray wavelength, and thus, it may easily form metal nuclei for Cu-electroless plating.

Thus formed metal nuclei may be optionally exposed at a predetermined region to which electromagnetic wave is irradiated, to form an adhesion active surface of a polymer resin substrate. Thereafter, by the chemical reduction of the metal nuclei, or electroless plating with a plating solution comprising conductive metal ions, and the like, using the metal nuclei as seeds, a conductive metal layer may be formed on the adhesion active surface comprising the metal nuclei. Particularly, as explained above, due to the structural characteristics of the non-conductive metal compound, if electromagnetic wave of near infrared ray wavelength is irradiated to the non-conductive metal compound, metal nuclei may be easily formed even with low electromagnetic wave power. And, the metal nuclei may easily form a conductive pattern by reduction or plating, for example, Cu-electroless plating.

Meanwhile, in the composition of one embodiment, the non-conductive metal compound not only exhibits non-conductiveness property before the irradiation of electromagnetic wave of near infrared ray area, but also has excellent compatibility with the polymer resin and is chemically stable even to the solution used for the reduction or plating, thus maintaining non-conductiveness.

Thus, in the region to which electromagnetic wave is not irradiated, the non-conductive metal compound is chemically stably maintained while being uniformly dispersed in the polymer resin substrate, thus exhibiting non-conductiveness. To the contrary, in the predetermined region to which electromagnetic wave of near infrared ray wavelength is irradiated, metal nuclei may be easily formed from the non-conductive metal compound on the above explained principle, thus easily forming a conductive micropattern.

Thus, by using the composition of the above explained embodiment, conductive micropatterns may be formed on various polymer resin substrates such as polymer resin products or resin layers, and the like, by a very simplified process of irradiating electromagnetic wave such as laser and the like, and particularly, metal nuclei that facilitate the formation of the conductive pattern may be very easily formed, and thus, compared to previously known compositions of the same kind, better conductive patterns may be very easily formed.

In addition, since the compound having a spinel structure such as $CuCr_2O_4$ and the like shows dark black, a composition comprising such a non-conductive metal compound may not be suitable for realizing polymer resin products or resin layers of various colors. To the contrary, since $Cu_3P_2O_8$, one of the compounds represented by the Chemical Formula 1 has a low absorbance of visible ray area (about 300 nm to 700 nm) as shown in FIG. 2, it may show relatively bright color. Thus, $Cu_3P_2O_8$ may hardly color various polymer resin products or resin layers. Thus, using the composition of one embodiment, a requirement of the art to realize various colors of various polymer resin products even with a relatively small amount of color additives may be more effectively satisfied. And, also in case a part of Cu is substituted with other transition metals (Ti, V, Cr, Mn, Fe, Co, Ni, Y, Zn, Nb, Mo, Tc, Pd, Ag, Ta, W, Pt, Mg, Ca, Sr and Au, and the like) in $Cu_3P_2O_8$, the above purpose may be achieved. Particularly, if a part of Cu is substituted with Zn, the color may be more brightened than $Cu_3P_2O_8$.

Meanwhile, in the composition for forming a conductive pattern of the above explained embodiment, as the polymer resin, any thermosetting resin or thermoplastic resin capable of forming various polymer resin products or resin layers may be used without specific limitations. Particularly, the above explained specific non-conductive metal compound may exhibit excellent compatibility with various polymer resins and uniform dispersibility, and the composition of one embodiment may comprise various polymer resins and be molded into various resin products or resin layers. Specific examples of the polymer resin may include ABS (Acrylonitrile poly-butadiene styrene) resin, polyalkylene terephthalate resin such as polybutylene terephthalate resin or polyethylene terephthalate resin, and the like, polycarbonate resin, polypropylene resin and polyphthalamide resin, and the like, and besides, various polymer resins may be included.

And, in the composition for forming a conductive pattern, the non-conductive metal compound represented by the Chemical Formula 1 may be included in the content of about 0.1 to 15 wt %, or about 1 to 10 wt %, based on the total composition, and the remaining content of polymer resin may be included. Within the above content range, the characteristic in that a conductive pattern is formed on a specific region by electromagnetic wave irradiation, while appropriately maintaining basic properties such as mechanical properties of the polymer resin product or resin layer formed from the composition, may be preferably exhibited.

And, the composition for forming a conductive pattern may further comprise one or more additives selected from the group consisting of a flame retardant, a heat stabilizer, a UV stabilizer, a lubricant, an antioxidant, inorganic filler, a color additive, an impact modifier and a functional reinforcing agent. By the addition of the additives, the properties of the resin structure obtained from the composition of one embodiment may be appropriately reinforced. Among the additives, the color additive, for example, a pigment may be included in the content of about 0.1 to 10 wt % to give a desired color to the resin structure.

Representative examples of the color additives such as pigment may include white pigments such as ZnO, ZnS, Talc, $TiO_2$, $SnO_2$, or $BaSO_4$ and the like, and besides, color additives such as pigments of various kinds and colors previously known to be usable in a polymer resin composition may be used.

The flame retardant may include a phosphorus flame retardant and an inorganic flame retardant. More specifically, the phosphorus flame retardant may include a phosphate ester flame retardant including triphenyl phosphate (TPP), trixylenyl phosphate (TXP), tricresyl phosphate (TCP), or triisophenyl phosphate (REOFOS), and the like; an aromatic polyphosphate flame retardant; a polyphosphate flame retardant; or a red phosphorus flame retardant, and the like, and besides, various phosphorus flame retardants known to be usable in the resin composition may be used without specific limitations. And, the inorganic flame retardant may include aluminum hydroxide, magnesium hydroxide, zinc borate, molybdenum oxide ($MoO_3$), molybdenum peroxide salt ($Mo_2O_7^{2-}$), calcium-zinc-molybdate, antimony trioxide ($Sb_2O_3$), or antimony pentaoxide ($Sb_2O_5$), and the like. However, examples of the inorganic flame retardant are not limited thereto, and various inorganic flame retardants known to be usable in a resin composition may be used without specific limitations.

And, the impact modifier, heat stabilizer, UV stabilizer, lubricant or antioxidant may be included in the content of about 0.01 to 5 wt %, or about 0.05 to 3 wt %, to appropriately manifest desired properties in the resin structure.

Meanwhile, hereinafter, a method of forming a conductive pattern on a polymer resin substrate such as a polymer product or a polymer layer and the like, by direct irradiation of electromagnetic wave, using the composition for forming a conductive pattern of the above explained embodiment, will be explained in detail. Such a method of molding a conductive pattern may comprise the steps of forming the above explained composition for forming a conductive pattern into a resin product, or coating it on another product to form a resin layer; irradiating electromagnetic wave to a predetermined region of the resin product or resin layer to generate metal nuclei from the non-conductive metal compound particles comprising the compound represented by the Chemical Formula 1; and chemically reducing or plating the region where the metal nuclei are generated to form a conductive metal layer.

Hereinafter, the method of forming a conductive pattern will be explained according to each step, referring to attached drawing. For reference, FIG. 3 simplifies and shows one example of the method of forming a conductive pattern according to process steps.

In the method of forming a conductive pattern, first, the above explained composition for forming a conductive pattern may be molded into a resin product, or it may be coated on another product to form a resin layer. For the molding of a resin product or formation of a resin layer, a method of molding a product or a method of forming a resin layer using common polymer resin compositions may be applied without specific limitations. For example, for the molding of a resin product using the composition, the composition for forming a conductive pattern may be extruded and cooled, and then, formed as pellets or particles, which may be injection molded into a desired shape to prepare various polymer resin products.

The formed polymer resin product or resin layer may have a shape wherein the above explained specific non-conductive metal compound is uniformly dispersed on a resin substrate formed from the polymer resin. Particularly, since the non-conductive metal compound comprising the compound of the Chemical Formula 1 has excellent compatibility with various polymer resins and chemical stability, it may be uniformly dispersed over the whole area of the resin substrate and maintained non-conductive.

Figure 3:
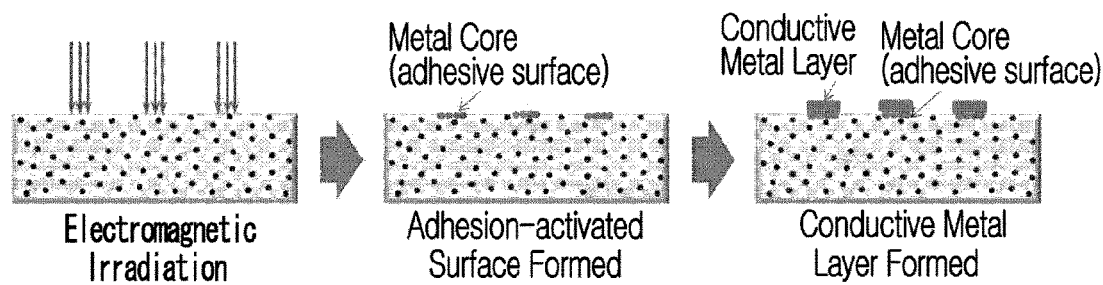
FIG. 3 simplifies and shows one example of a method for forming a conductive pattern using the composition according to one embodiment of the invention according to process steps.

After forming the polymer resin product or resin layer, as shown in the first drawing of FIG. 3, to a predetermined region of the resin product or resin layer where a conductive pattern is to be formed, electromagnetic wave such as laser may be irradiated. If the electromagnetic wave is irradiated, metal or ions thereof may be discharged from the non-conductive metal compound, and metal nuclei comprising the same may be generated (see the second drawing of FIG. 3).

More specifically, if the step of generating metal nuclei by electromagnetic wave irradiation is progressed, a part of the non-conductive metal compound comprising the compound of the Chemical Formula 1 is exposed to the predetermined surface region of the resin product or resin layer, metal nuclei are generated therefrom, and an adhesion active surface that is activated so as to have higher adhesion property may be formed. Since such an adhesion active surface is selectively formed only at a certain region to which electromagnetic wave is irradiated, if a plating step and the like as described below is progressed, conductive metal ions may be chemically reduced by the chemical reduction of the conductive metal ions included in the metal nuclei and the adhesion active surface, and/or electroless plating thereof, and thus, the conductive metal layer may be selectively formed on a predetermined region of the polymer resin substrate. More specifically, at the time of the electroless plating, the metal nuclei may act as seeds, and when the conductive metal ions included in the plating solution are chemically reduced, form strong bonds thereto. As the result, the conductive metal layer may be more easily selectively formed.

Meanwhile, in the step of generating metal nuclei, among electromagnetic waves, laser electromagnetic wave may be irradiated, and for example, laser electromagnetic wave having a wavelength of near infrared ray (NIR) area of about 755 nm, about 1064 nm, about 1550 nm or about 2940 nm may be irradiated. According to another example, laser electromagnetic wave having a wavelength of infrared ray (IR) area may be irradiated. And, the laser electromagnetic wave may be irradiated under common conditions or power.

By the irradiation of laser, metal nuclei may be more effectively generated from the non-conductive metal compound comprising the compound represented by the Chemical Formula 1, and an adhesion active surface comprising the same may be selectively generated and exposed to a predetermined region.

Meanwhile, after progressing the step of generating metal nuclei, as shown in the third drawing of FIG. 3, a step of chemically reducing or plating the region where metal nuclei are generated to form a conductive metal layer may be progressed. As the result of progressing such a reducing or plating step, a conductive metal layer may be selectively formed in the predetermined region where the metal nuclei and the adhesion active surface are exposed, and in the remaining region, a chemically stable non-conductive metal compound may maintain non-conductiveness intactly. Thus, a conductive micropattern may be selectively formed only in the predetermined region on the polymer resin substrate.

More specifically, the step of forming the conductive metal layer may be progressed by electroless plating, and thereby, a good conductive metal layer may be formed on the adhesion active surface. Particularly, the adhesion active surface formed from the non-conductive metal compound comprising the compound represented by the Chemical Formula 1 may effectively form a conductive micropattern by Cu-electroless plating.

According to one example, in the reducing or plating step, the resin product or resin layer of the predetermined region where metal nuclei are generated may be treated with an acid or base solution comprising a reducing agent, and the solution may include one or more selected from the group consisting of formaldehyde, hydrophosphite, dimethlyaminoborane (DMAB), diethylaminoborane (DEAB) and hydrazine. And, in the reducing or plating step, it may be treated with an electroless plating solution comprising the reducing agent and conductive metal ions to form a conductive metal layer by electroless plating.

By the progress of the reducing or plating step, in the region where metal nuclei are formed, with the metal nuclei as seeds, the conductive metal ions included in the electroless plating solution may be chemically reduced to selectively form a good conductive pattern in the predetermined region. At this time, the metal nuclei and the adhesion active surface may form strong bonds with the chemically reduced conductive metal ions, and as the result, a conductive pattern may be more easily formed selectively in the predetermined region.

And, in the remaining region where such a conductive pattern is not formed, the non-conductive metal compound comprising the compound represented by the Chemical Formula 1 is uniformly dispersed in the resin structure.

Meanwhile, according to another embodiment of the invention, a resin structure having a conductive pattern obtained by the above explained composition for forming a conductive pattern and method of forming a conductive pattern is provided. Such a resin structure may comprise a polymer resin substrate; a non-conductive metal compound dispersed in the polymer resin substrate, and comprising a compound represented by the above Chemical Formula 1; an adhesion active surface comprising metal nuclei comprising copper metal or copper ions exposed to a predetermined region of the polymer resin substrate surface; and a conductive metal layer formed on the adhesion active surface.

In the resin structure, the predetermined region where the adhesion active surface and the conductive metal layer are formed may correspond to the region of the polymer resin substrate to which electromagnetic wave is irradiated. And, the metal or ions thereof included in the metal nuclei of the adhesion active surface may be derived from the non-conductive metal compound comprising the compound represented by the Chemical Formula 1. Meanwhile, the conductive metal layer may be derived from the metal included in the non-conductive metal compound comprising the compound represented by the Chemical Formula 1, or it may be derived from the conductive metal ions included in the electroless plating solution.

And, the resin structure may further comprise residues derived from the non-conductive metal compound. The residue may have a structure wherein at least a part of the metal included in the non-conductive metal compound is discharged, to form vacancy on at least a part of the site.

The above explained resin structure may be manufactured into various resin products or resin layers such as mobile phones or table PC cases having conductive patterns for antenna, or it may be manufactured into various resin products or resin layers having conductive patterns such as RFID tags, various sensors or MEMS structures, and the like.

As explained above, according to embodiments of the invention, various resin products having conductive micropatterns may be satisfactorily and easily formed by a very simplified method of irradiating electromagnetic wave such laser and reducing or plating.

Hereinafter, the actions and the effects of the invention will be explained in more detail through specific examples. However, these are presented only as illustrations of the invention, and the scope of the invention is not limited thereto.

Example 1

Figure 4:
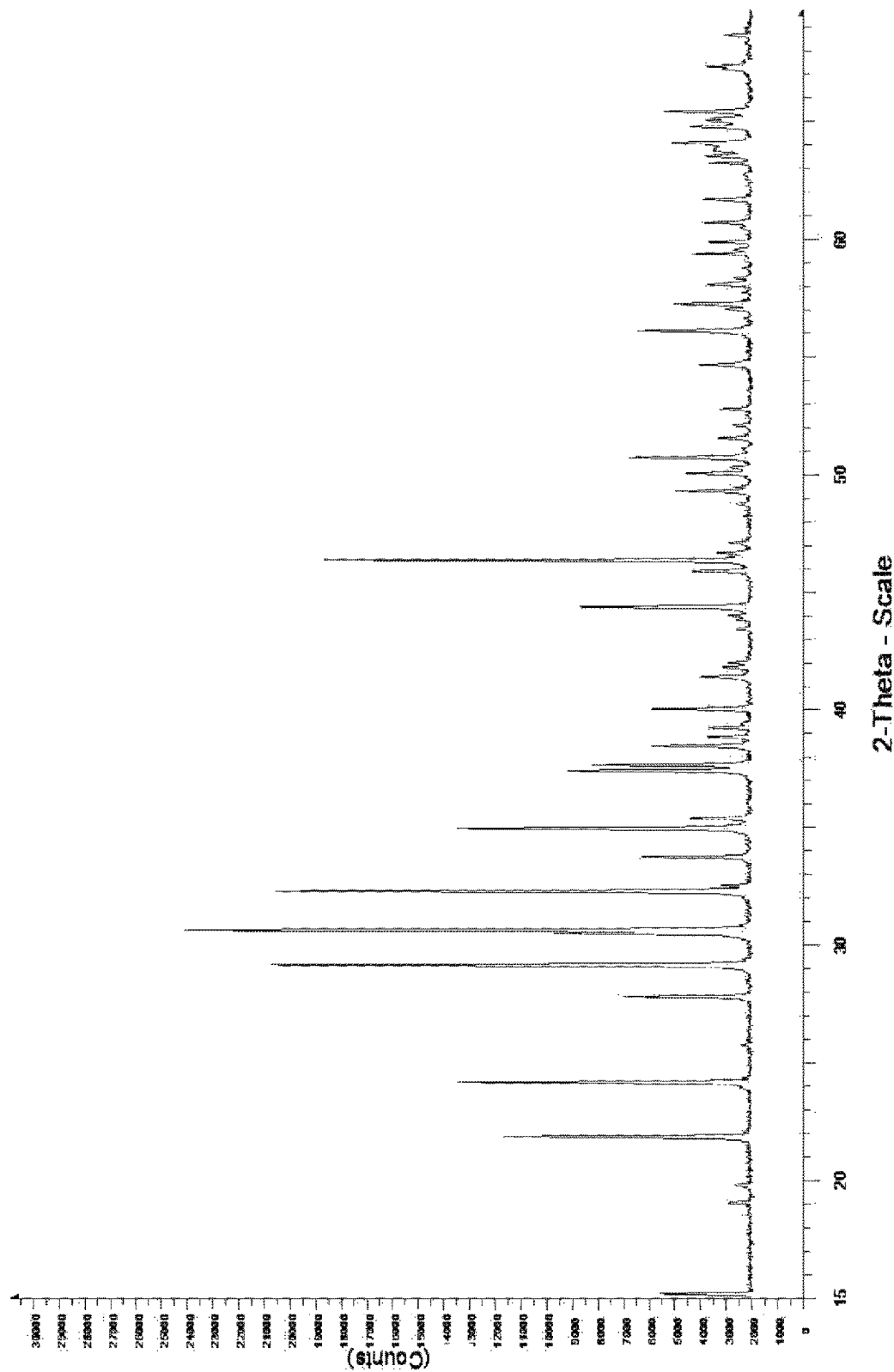
FIG. 4 shows the XRD patterns of the non-conductive metal compounds used in Examples 1 and 2.

$Cu_3P_2O_8$ having a triclinic structure was synthesized through a solid state reaction of heating a mixture of CuO and $(NH_4)_2HPO_4$ at a ratio of 3:2 at 1000° C. for 10 hours. And, the XRD (X-ray Diffraction) pattern showing the crystal properties is shown in FIG. 4.

Using polycarbonate resin as basic resin, and the above prepared $Cu_3P_2O_8$ as a non-conductive metal compound, together with additives for the process and stabilization, a composition for forming a conductive pattern by electromagnetic wave irradiation was prepared.

As the additives, a heat stabilizer (IR1076, PEP36), a UV stabilizer (UV329), a lubricant (EP184), and an impact modifier (S2001) were used.

90 wt % of the polycarbonate resin, 5 wt % of the $Cu_3P_2O_8$, and 5 wt % of other additives were mixed to obtain a composition, which was extruded through an extruder at a temperature of 260 to 280° C. The extruded composition in the form of a pellet was injection molded into a substrate with a diameter of 100 mm and a thickness of 2 mm, and an izod bar of ASTM standard at about 260 to 270° C.

To the injection molded specimen, laser with wavelength of 1064 nm was irradiated under 40 kHz, 7 W condition to activate the surface, and an electroless plating process was conducted as follows.

A plating solution (hereinafter, referred to as PA solution) was prepared by dissolving 3 g of copper sulfate, 14 g of Rochelle salt, and 4 g of sodium hydroxide in 100 ml of deionized water. To 40 ml of the prepared PA solution, 1.6 ml of formaldehyde was added as a reducing agent. The resin structure of which surface was activated by laser was immersed in the plating solution for 4 to 5 hours, and then, washed with distilled water.

On the adhesion active surface comprising metal nuclei of the resin structure to which 7 W laser power was irradiated, a satisfactory conductive pattern (copper metal layer) was formed through Cu-electroless plating.

Example 2

A resin structure having a conductive pattern was formed by the same method as Example 1, except that 5 wt % of $TiO_2$ was added as a pigment to the composition for forming a conductive pattern of Example 1. In Example 2, a resin structure of a brighter color than Example 1 was formed, and a satisfactory conductive pattern (copper metal layer) was formed as in Example 1.

Example 3

Figure 5:
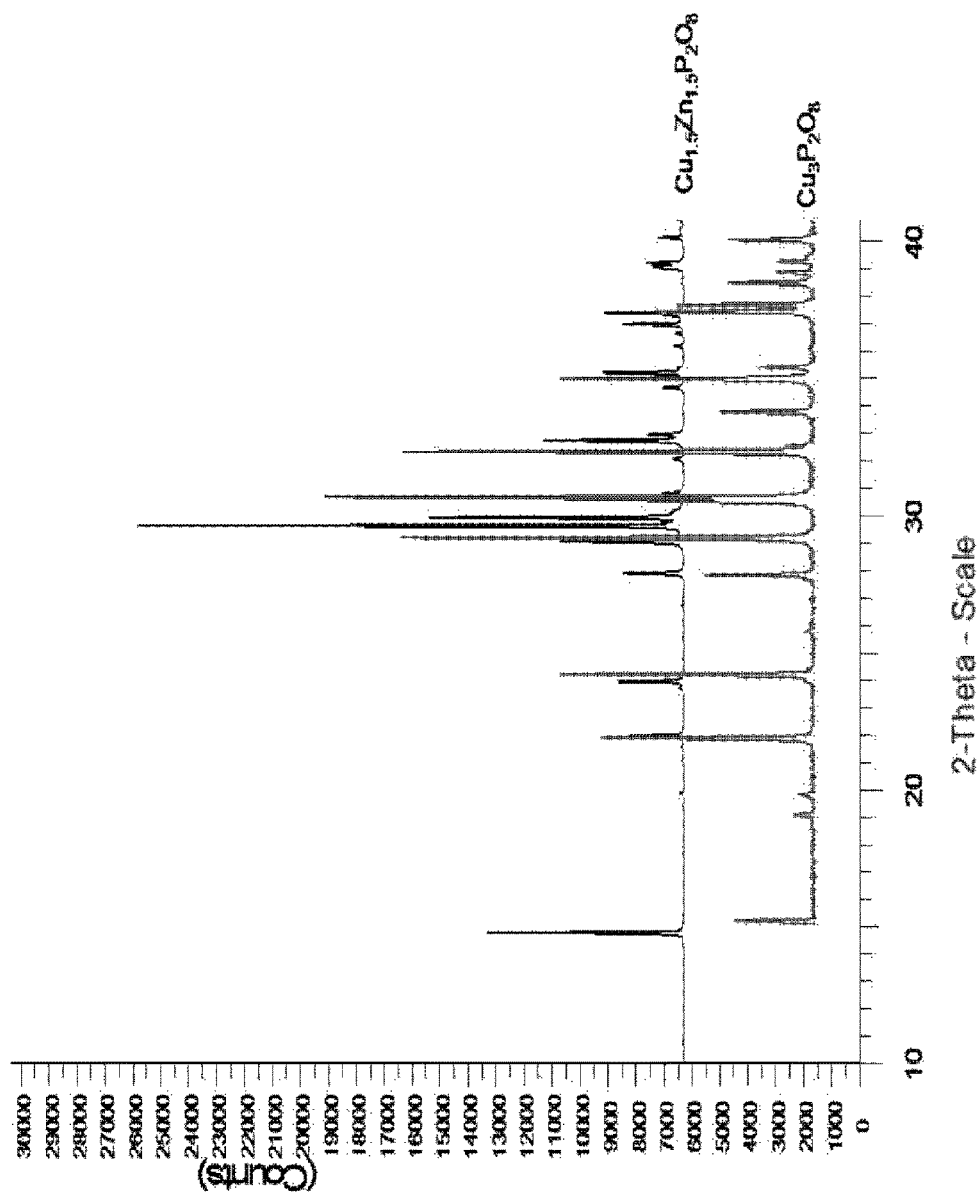
FIG. 5 compares the XRD patterns of $Cu_3P_2O_8$ and $Cu_{1.5}Zn_{1.5}P_2O_8$.

$Cu_{1.5}Zn_{1.5}P_2O_8$ having a triclinic structure was synthesized through a solid state reaction of heating a mixture of CuO; ZnO; and $(NH_4)_2HPO_4$ at a mole ratio of 1.5:1.5:2 at 950° C. for 10 hours, and the XRD (X-ray Diffraction) pattern showing the crystal properties is shown in FIG. 5. As shown in FIG. 5, although three vectors of the unit cell and the angles are changed by substituted Zn and peak shift is observed in $Cu_{1.5}Zn_{1.5}P_2O_8$, it generally shows a similar XRD pattern to that of $Cu_3P_2O_8$. From the XRD pattern, it is confirmed that $Cu_{1.5}Zn_{1.5}P_2O_8$ also belongs to a $P\bar{1}$ space group of a triclinic structure.

A resin structure having a conductive pattern was prepared by the same method as Example 1, except that the $Cu_{1.5}Zn_{1.5}P_2O_8$ was used as a non-conductive metal compound instead of $Cu_3P_2O_8$ in Example 1.

Comparative Example 1

A composition for forming a conductive pattern was prepared by the same method as Example 2, except that Sb-doped $SnO_2$ coated on mica was used as the non-conductive metal compound instead of $Cu_3P_2O_8$ in Example 2, and it was used to prepare injection molded specimen under the same conditions as Example 2.

However, even if laser of the same conditions as Example 2 was irradiated to the injection molded specimen, a metal nucleus or an adhesion active surface was not easily formed on the region exposed to laser. Thus, the adhesive strength of the conductive pattern formed through Cu-electroless plating was not satisfactory.

Figure 6:
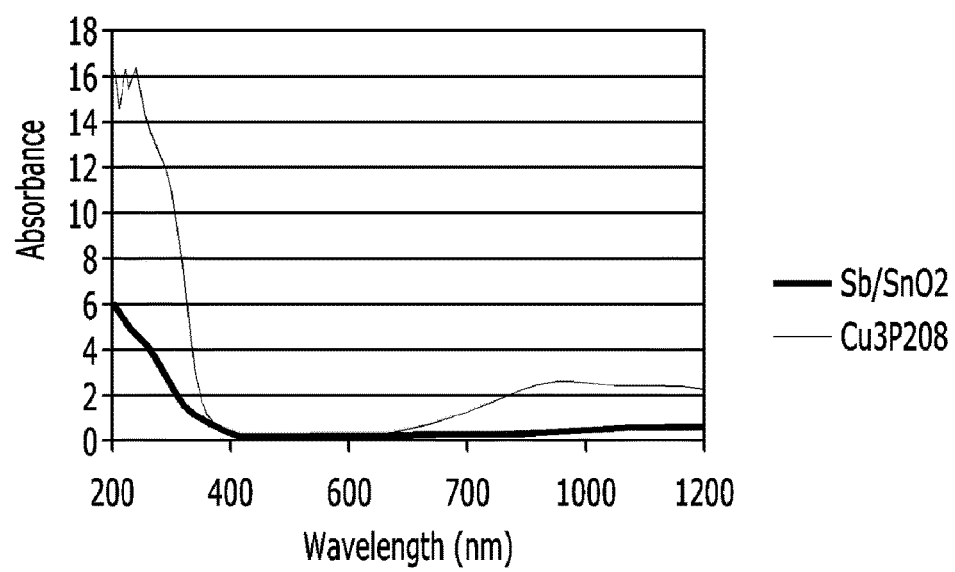
FIG. 6 shows the absorbance according to wavelength (nm) of $Cu_3P_2O_8$ and Sb-doped $SnO_2$ coated on mica.

It is expected that an adhesion active surface was not easily formed in Comparative Example 1 compared to Examples, because the absorbance of the Sb-doped $SnO_2$ coated on mica used in Comparative Example 1 is lower than that of $Cu_3P_2O_8$ used in Examples 1 and 2, as shown in FIG. 6, Thus, 13 W laser was irradiated to the injection molded specimen to activate the surface, and an electroless plating process was conducted by the same method as Example 1.

From the result, it is confirmed that the non-conductive metal compound having high absorbance according to one embodiment of the invention is effective for forming metal nuclei comprising copper metal or copper ions or an adhesion active surface even with low laser irradiation power.

Comparative Example 2

A resin structure having a conductive pattern was prepared by the same method as Example 1, except that $Cu_2(OH)PO_4$ was used as the non-conductive metal compound instead of $Cu_3P_2O_8$ in Example 1.

Experimental Example

In order to confirm whether or not the non-conductive metal compounds used in Examples and Comparative Examples influence on the stability of polymer resin, the melt index of a polycarbonate resin substrate to which a non-conductive metal compound was not added and the melt indexes of the resin structures prepared in Examples and Comparative Examples were compared.

Specifically, the melt index (MI) was measured at a temperature of 300° C. and under a load of 2.16 kg according to ASTM D1238.

TABLE 1

|  | Melt index [g/10 min] |
|---|---|
| Polycarbonate resin substrate | 17 |
| Example 1 | 16 |
| Comparative Example 1 | 26 |
| Comparative Example 2 | 33 |

Referring to the Table 1, the resin structure of Example 1 showed a melt index very close to the melt index of the polycarbonate resin substrate to which a non-conductive metal compound was not added. Thereby, it is confirmed that the non-conductive metal compound used in Example 1 does not cause degeneration of polymer resin. Thus, it is confirmed that a resin structure with excellent heat stability can be provided using the non-conductive metal compound according to one embodiment of the invention in Example 1.

To the contrary, the resin structures of Comparative Examples 1 and 2 showed very high melt indexes compared to the polycarbonate resin substrate to which a non-conductive metal compound was not added. Thereby, it is confirmed that the Sb-doped $SnO_2$ coated on mica used in Comparative Example 1 and $Cu_2(OH)PO_4$ used in Comparative Example 2 cause degeneration of resin, and thus, if a resin structure is prepared using the same, poor heat stability is exhibited.

The invention claimed is:

1. A composition for forming a conductive pattern by electromagnetic wave irradiation, comprising:
    polymer resin; and
    a non-conductive metal compound comprising a compound represented by Chemical Formula 1,
    wherein metal nuclei can be formed form the non-conductive metal compound by the electromagnetic wave irradiation:

$Cu_{3-x}M_xP_2O_8$         [Chemical Formula 1]

wherein, in Chemical Formula 1,
    M is one or more metal selected form the group consisting of Ti, V, Cr, Mn, Fe, Co, Ni, Y, Zn, Nb, Mo, Tc, Pd, Ag, Ta, W, Pt and Au, and x is a rational number of more than 0 and less than 3.

2. The composition for forming a conductive pattern by electromagnetic wave irradiation according to claim 1, wherein the non-conductive metal compound has a triclinic structure, and belongs to a P$\bar{1}$ space group.

3. The composition for forming a conductive pattern by electromagnetic wave irradiation according to claim 1, wherein the non-conductive metal compound has a three dimensional structure in which square planar $CuO_4$ or $MO_4$; a trigonal bipyramid of $CuO_5$ or $MO_5$; and a tetrahedron of $PO_4$ are three-dimensionally connected while sharing oxygen.

4. The composition for forming a conductive pattern by electromagnetic wave irradiation according to claim 1, wherein the polymer resin includes thermosetting resin.

5. The composition for forming a conductive pattern by electromagnetic wave irradiation according to claim 4, wherein the polymer resin includes one or more selected from the group consisting of ABS resin, polyalkylene terephthalate resin, polycarbonate resin, polypropylene resin and polyphthalamide resin.

6. The composition for forming a conductive pattern by electromagnetic wave irradiation according to claim 1, wherein the non-conductive metal compound is included in the content of 0.1 to 15 wt %, based on the total composition.

7. The composition for forming a conductive pattern by electromagnetic wave irradiation according to claim 1, further comprising one or more additives selected from the group consisting of a flame retardant, a heat stabilizer, a UV stabilizer, a lubricant, an antioxidant, an inorganic filler, a color additive, an impact modifier and a functional reinforcing agent.

8. The composition for forming a conductive pattern by electromagnetic wave irradiation according to claim 1, wherein the polymer resin includes thermoplastic resin.

9. A resin structure having a conductive pattern comprising:
    a polymer resin substrate;
    a non-conductive metal compound dispersed in the polymer resin substrate, and comprising a compound represented by Chemical Formula 1;
    an adhesion active surface comprising metal nuclei exposed to a predetermined region of a surface of the polymer resin substrate; and
    a conductive metal layer formed on the adhesion active surface that forms the conductive pattern:

$Cu_{3-x}M_xP_2O_8$         [Chemical Formula 1]

wherein, in Chemical Formula 1,

M is one or more metal selected form the group consisting of Ti, V, Cr, Mn, Fe, Co, Ni, Y, Zn, Nb, Mo, Tc, Pd, Ag, Ta, W, Pt and Au, and x is a rational number of more than 0 and less than 3.

10. The resin structure having a conductive pattern according to claim 9, wherein the predetermined region on which the adhesion active surface and the conductive metal layer are formed corresponds to a region of the polymer resin substrate to which electromagnetic wave is irradiated.

* * * * *